United States Patent
Takase

(10) Patent No.: US 6,744,799 B2
(45) Date of Patent: Jun. 1, 2004

(54) SEMICONDUCTOR LASER WITH MULTIPLE QUANTUM WELL ACTIVE LAYER INCLUDING MODULATION-DOPED BARRIER LAYERS

(75) Inventor: Tadashi Takase, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/298,649

(22) Filed: Nov. 19, 2002

(65) Prior Publication Data

US 2003/0214989 A1 Nov. 20, 2003

(30) Foreign Application Priority Data

May 17, 2002 (JP) ........................................ 2002-142597

(51) Int. Cl.[7] ................................................. H01S 5/00
(52) U.S. Cl. ............................ 372/46; 372/43; 372/45
(58) Field of Search ............................ 372/43, 45, 46, 372/50

(56) References Cited

U.S. PATENT DOCUMENTS

| | | | | |
|---|---|---|---|---|
| 4,881,238 A | * | 11/1989 | Chinone et al. ............... 372/68 |
| 5,198,682 A | * | 3/1993 | Wu et al. ....................... 257/21 |
| 5,239,186 A | * | 8/1993 | McIver et al. ................. 257/21 |
| 5,319,657 A | * | 6/1994 | Otsuka et al. ................. 372/43 |
| 5,351,254 A | * | 9/1994 | Tomita .......................... 372/45 |
| 6,240,114 B1 | * | 5/2001 | Anselm et al. ................ 372/45 |

FOREIGN PATENT DOCUMENTS

JP 6-334258 12/1994

* cited by examiner

*Primary Examiner*—David Porta
*Assistant Examiner*—Davienne Monbleau
(74) *Attorney, Agent, or Firm*—Leydig, Voit & Mayer, Ltd.

(57) ABSTRACT

In a semiconductor laser which is modulation-doped in an active layer having a multiple quantum well structure, emission efficiency and modulation-band are improved. A semiconductor laser has an active layer between a p-type cladding layer and an n-type cladding layer. The active layer has multiple quantum wells with a plurality of barrier layers and well layers, and at least one barrier layer is p-type modulation-doped. More specifically, quantity of p-type modulation-doping of a barrier layer close to the p-cladding layer is smaller than of a barrier layer close to the n-cladding layer. Therefore, differential gain and high-speed response can be improved while suppressing nonluminous recombination. Since the concentration of holes is high in a well layer distant from the p-type cladding layer, the nonuniformity of carrier concentration can also be reduced.

5 Claims, 4 Drawing Sheets

SEMICONDUCTOR LASER WITH MULTIPLE QUANTUM WELL ACTIVE LAYER INCLUDING MODULATION-DOPED BARRIER LAYERS

BACKGROUND OF THE INVENTION

1. Field of the Invention

The present invention relates to a semiconductor laser which can be used as a light source of an optical communication apparatus and, more particularly, to a structure of a semiconductor laser which is suitably used to improve emission efficiency and a modulation band.

2. Description of the Background Art

With the recent development of information technology, demands for transmitting a large amount of information more rapidly and more distantly are rising. In order to reply to the demands, an optical communication technique using an optical fiber is developed, and is popularly used at the present. For example, in a semiconductor laser serving as a light source which is a key device in a communication apparatus, a large number of techniques for improving emission efficiency and high-speed response (i.e. a large modulation band) are used. More specifically, the semiconductor laser has an active layer which employs a multiple quantum well structure or a modulation-doped structure. With such techniques, as much information as possible can be transmitted at short intervals.

FIG. 4 is a conceptual energy band diagram of a multiple quantum well structure in an active layer of a semiconductor laser. The principle of emission of a laser having the illustrated structure will be described below. On a valence band side 21, holes 22 are injected from a p-type cladding layer side 2 into respective valence band well layers 23 through a light confinement layer 3. On conduction band side 26, electrons 27 are implanted from an n-type cladding layer side 6 into the conduction band well layer. Holes 22 and electrons 27 are combined to each other to generate light 28.

The laser shown in FIG. 4 has a multiple quantum well active layer 4 constituted by a plurality of quantum wells. With this structure, concentrations of holes 22 and electrons 27 become high, and an optical gain increases. According to this reason, emission efficiency is improved. At the same time, since a differential gain also increases, a relaxation oscillation frequency which expresses the modulation band of the laser also increases.

As another means for improving emission efficiency and modulation band, a technique is modulation-doped in which p-type or n-type doping of only the barrier layer 24 of multiple quantum wells of an active layer is provided. This technique is introduced to JAPANESE JOURNAL OF APPLIED PHYSICS VOL. 29, (1990) 81. According to this reference, when p-type doping is performed to barrier layer 24 of the multiple quantum well, gain spectrum is narrowed by a large number of holes 22 supplied from an acceptor level. Therefore, the differential gain increases, and the modulation band is improved. On the other hand, when n-type doping is performed, optical absorption is suppressed. Therefore, a threshold current is reduced, and emission efficiency is improved.

However, in the above technique, improvements of emission efficiency and modulation band may be able to be achieved insufficiently.

More specifically, consider that the number of quantum wells is excessively increased. In this situation, when holes 22 are injected from p-type cladding layer 2 into valence band well layers 23, holes 22 may not reach valence band well layer 23 because it is distant from p-type cladding layer 2 (i.e., on a light confinement layer 5 side). This is because holes 22 have effective masses. Therefore, hole concentrations in valence band well layers 23 are not uniform, and the effect of the multiple quantum wells is deteriorated.

Furthermore, even though modulation-doping is performed to only barrier layer 24 of the multiple quantum wells of the active layer to manufacture a semiconductor layer, p-type or n-type impurities which should only be in the barrier layer 24 actually diffuse to the well layer due to the thermal history of epitaxial growth or the like in the manufacture. For this reason, the impurity deteriorates crystallinity of the well layer serving as a light-emitting section and increase the nonluminous recombination ratio, so that the improvement effect is suppressed. This problem becomes significant as the concentration of added impurity becomes high and as the degree of diffusion of Zn or the like is high.

SUMMARY OF THE INVENTION

It is an object of the present invention to sufficiently improve emission efficiency and a modulation band in a semiconductor laser in which modulation-doping is performed to an active layer of a multiple quantum well structure.

A semiconductor laser of the present invention has an active layer formed between a p-type cladding layer and an n-type cladding layer. The active layer has multiple quantum wells having a plurality of barrier layers and well layers. P-type modulation-doping is performed to at least one of the barrier layers.

More specifically, a quantity of p-type modulation-dope of the barrier layer at a position close to the p-type cladding layer is smaller than that at a position close to the n-type cladding layer. For example, the quantity of p-type modulation-dope may be determined depending on a distance from the p-type cladding layer, or the quantities of p-type modulation-dope in barrier layers at a position close to the p-type cladding layer are gradually decreased. In addition, p-type modulation-doping may be performed at a first quantity of dope in at least one barrier layer at a position closer to the n-type cladding layer than a barrier layer at a predetermined position, and may be performed at a second quantity of dope smaller than the first quantity of dope in at least one barrier layer at a position closer to the p-type cladding layer than the barrier layer at the predetermined position. According to this feature, a differential gain and high-speed response can be improved while suppressing nonluminous recombination. At the same time, since the concentration of holes is high in a well layer distant from the p-type cladding layer, nonuniformity of carriers can also be improved. Note that p-type dopant of the p-type modulation-doping may be any one of Zn, Be, Cd, and C.

The semiconductor laser includes two light-reflecting films which have different reflectances such that the films are perpendicular to an end face opposing an active layer. According to the structure, light can be resonated and amplified. In particular, when the semiconductor laser further includes a diffraction grating, a fabry-Perot type laser which can extract a laser beam having a predetermined wavelength can be obtained. When a diffraction grating is arranged to overlap a layer surface of the active layer, a distribution feedback laser can be obtained. When a diffraction grating is arranged at a position distant from the layer surface of the active layer in the spreading direction of the layer surface, a Bragg reflector laser can be obtained.

BRIEF DESCRIPTION OF THE DRAWINGS

This and other objects and features of the present invention will become clear from the subsequent description of a preferred embodiment thereof made with reference to the accompanying drawings, in which like parts are designated by like reference numerals and in which.

DETAILED DESCRIPTION OF THE PREFERRED EMBODIMENTS

Figure 1:
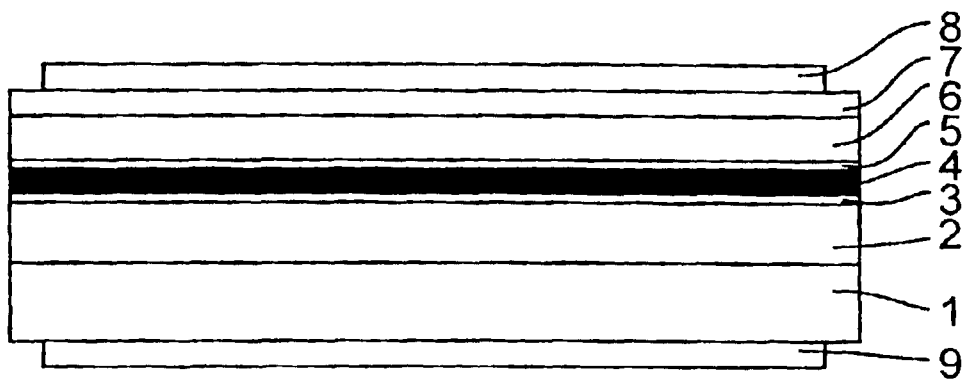
FIG. 1 is a sectional view of a layer structure of a semiconductor laser.

Embodiments of the present invention will be described below with reference to the accompanying drawings.
First Embodiment FIG. 1 is a sectional view of a layer structure of a semiconductor layer. The semiconductor laser can be formed by laminating layers by an epitaxial growth method. As the epitaxial growth method, for example, a metal-organic chemical vapor deposition (MOCVD) which flows a gas containing an organic metal to be grown toward a substrate and grows the organic metal by chemical reaction on the substrate surface, or a metal-organic molecular beam epitaxy (MOMBE) which vapors an organic metal in a high degree of vacuum condition toward a substrate to adhere the organic metal to the substrate and grows the organic metal can be used. More specifically, on an InP substrate 1, a p-InP cladding layer 2, an InGaAsP light confinement layer 3, an InGaAsP multiple quantum well active layer 4, an InGaAsP light confinement layer 5, an n-InP cladding layer side 6, and a contact layer 7 are laminated by epitaxial growth. Thereafter, metal electrodes 8 and 9 are formed, and cleavage is performed to obtain a resonator length. In order to resonate and amplify light inside the resonator, light-reflecting films (not shown) perpendicular to resonator end faces, i.e., the end faces of the respective layers are-coated. The resonator end faces includes at least an end face opposed to multiple quantum well active layer 4. In the following description, notations of materials of the respective layers are omitted. For example, p-InP cladding layer 2 is expressed as "p-type cladding layer 2", and InGaAsP light confinement layer 3 is expressed as "light confinement layer 3".

Figure 2:
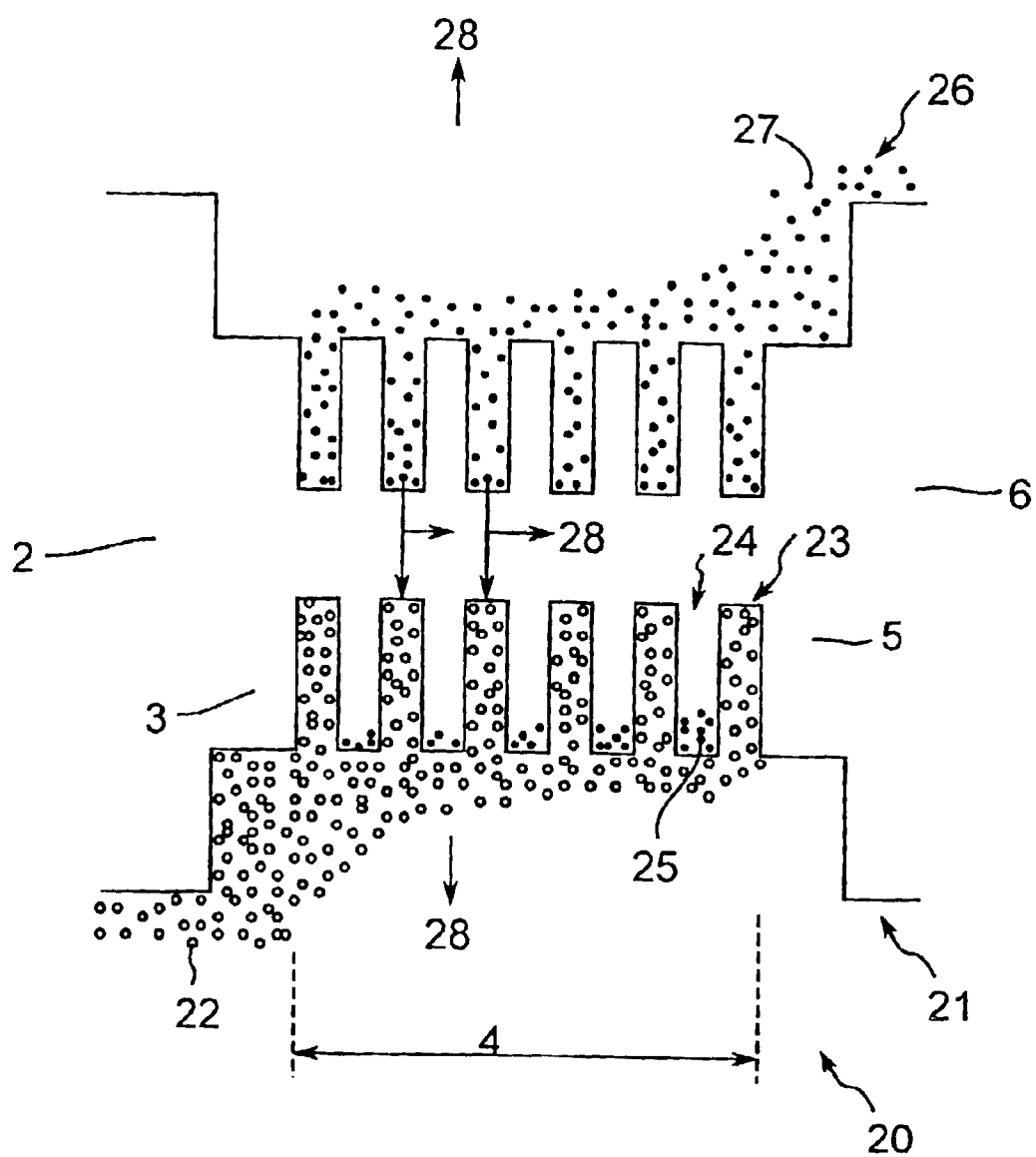
FIG. 2 is a conceptual energy band diagram in a periphery of a multiple quantum well active layer of the semiconductor laser (FIG. 1)

FIG. 2 is an energy conceptual diagram in periphery 20 of multiple quantum well active layer 4 of the semiconductor laser (FIG. 1). Starting from the left in FIG. 2, p-type cladding layer 2, light confinement layer 3, multiple quantum well active layer 4, light confinement layer 5, and n-type cladding layer side 6 are laminated. This structure corresponds to the layer structure of the semiconductor laser in FIG. 1. The principle of laser emission is the same as that of the prior art. More specifically, on valence band side 21, holes 22 are injected from p-type cladding layer side 2 into respective valence band well layers 23 through light confinement layer 3. On conduction band side 26, electrons 27 are injected from n-type cladding layer side 6 into the conduction band well layer. Holes 22 and electrons 27 are combined to each other to generate light 28. Although the light is emitted in all directions, only light in a direction parallel to each layer is extracted.

In the present invention, in multiple quantum well active layer 4 in which holes 22 are injected, a quantity of p-type dope to a barrier layer 24 close to p-type cladding layer 2 is set to be lower than that distant from p-type cladding layer 2 (i.e., close to n-type cladding layer side 6). In FIG. 2, in barrier layers 24, a p-type dopant 25 are shown. More specifically, as p-type dopant 25, Zn is used. The concentration of p-type dopant 25 is set to $1 \times 10^{18}$ cm$^3$ in barrier layer 24 close to p-type cladding layer 2. On the other hand, the concentration is set to $2 \times 10^{18}$ cm$^3$ in barrier layer 24 distant from p-type cladding layer 2. FIG. 2 typically shows that the number of black points representing the concentration of p-type dopant 25 is small in barrier layer 24 close to p-type cladding layer 2 and large in barrier layer 24 distant from p-type cladding layer 2. A change in concentration may be gradually (e.g., step-wisely) increased for every barrier layer 24 depending on the distance from p-type cladding layer 2 starting from barrier layer 24 close to p-type cladding layer 2. Otherwise, the concentration of p-type dopant 25 may be set to $1 \times 10^{18}$ cm$^3$ for barrier layer 24 close to p-type cladding layer 2 with respect to barrier layer 24 at a predetermined position (e.g., center), and the concentration may be set to $2 \times 10^{18}$ cm$^3$ for a distant barrier layer 24.

In the prior art, since doping is performed at a concentration of about $2 \times 18^{10}$ cm$^3$, for example, the dopant is diffused in well layer 23. However, essentially, the concentration of holes 22 injected in well layer 23 on a side close to p-type cladding layer 2 is high. Contrary, the concentration of holes 22 injected at a position in well layer 23 decreases as the position is distant from p-type cladding layer 2 (i.e., close to n-type cladding layer 6). Therefore, when a quantity of p-type dope of barrier layer 24 close to p-type cladding layer 2 is set to be smaller than that of barrier layer 24 distant from p-type cladding layer 2, in other words, barrier layer 24 at a position close to n-type cladding layer side 6, a differential gain and high-speed response can be improved while suppressing nonluminous recombination. At the same time, since the concentration of holes 22 is high in well layer 23 on the side distant from p-type cladding layer 2, the nonuniformity of carriers is also improved.

On the basis of the above description, in barrier layer 24 close to p-type cladding layer side 2, a quantity of p-type dope may be set to 0 (i.e., p-type doping is not performed), and the quantity of p-type dope may be set to $2 \times 10^{18}$ cm$^3$ in barrier layer 24 distant from p-type cladding layer 2. A position where the concentration changes may be set as a barrier layer 24 at a predetermined position (e.g., center) as in the above description.

Although Zn is used as the p-type dopant, the p-type dopant is not limited to Zn. For example, another p-type dopant such as Be, Cd, or C can also be used.
Second Embodiment In the second embodiment, an application of a semiconductor laser according to the first embodiment will be described. It has been described that in the semiconductor laser shown in FIG. 1, light-reflecting layers (not shown) are formed on the end faces of the respective layers to resonate and amplify the light. Such structure is generally called as a fabry-Perot structure.

In this embodiment, the semiconductor laser of the first embodiment is applied to a laser of another structure, which are a distribution feedback (DFB) laser and a Bragg reflector laser.

Figure 3A:
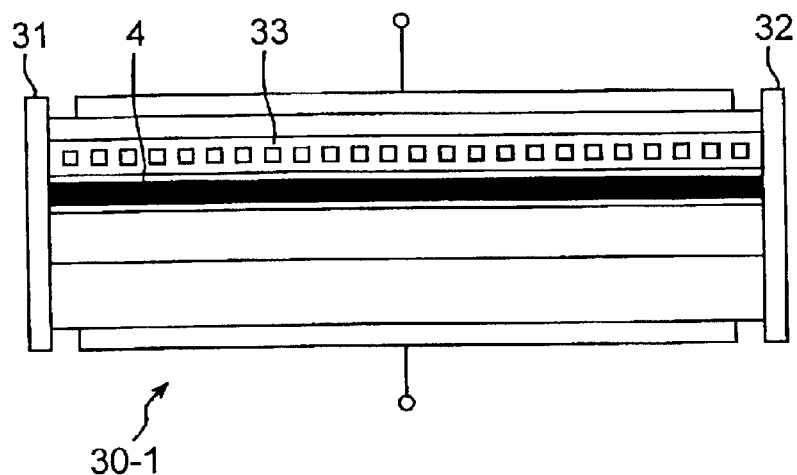
FIG. 3A is a sectional view of a configuration of a distribution feedback laser.

FIG. 3A is a sectional view of a distribution feedback laser 30-1. The distribution feedback laser 30-1 can output a laser beam having a specific wavelength. The distribution feedback laser 30-1 is constituted such that a diffraction grating 33 which extracts only a laser beam with a specific wavelength is arranged in the semiconductor laser of the first embodiment including the multiple quantum well active layer 4. Diffraction grating 33 is arranged to overlap the layer surface of multiple quantum well active layer 4. Diffraction grating 33 can be formed in laminating other layers mentioned in the first embodiment. In FIG. 3A, light-reflecting films 31 and 32 are also shown. When a laser beam is output toward the right in FIG. 3A, the reflectance of light-reflecting film 31 is high, and that of light-reflecting film 32 is low.

Figure 3B:
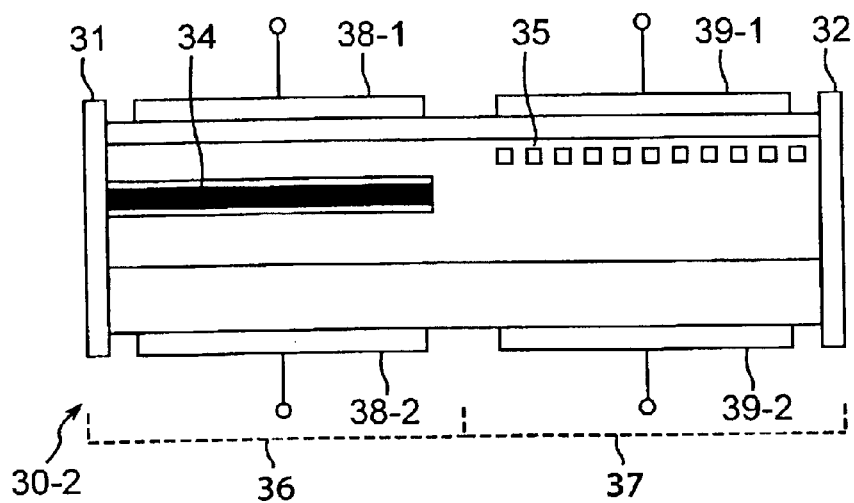
FIG. 3B is a sectional view of a configuration of a Bragg reflection laser.
Figure 4:
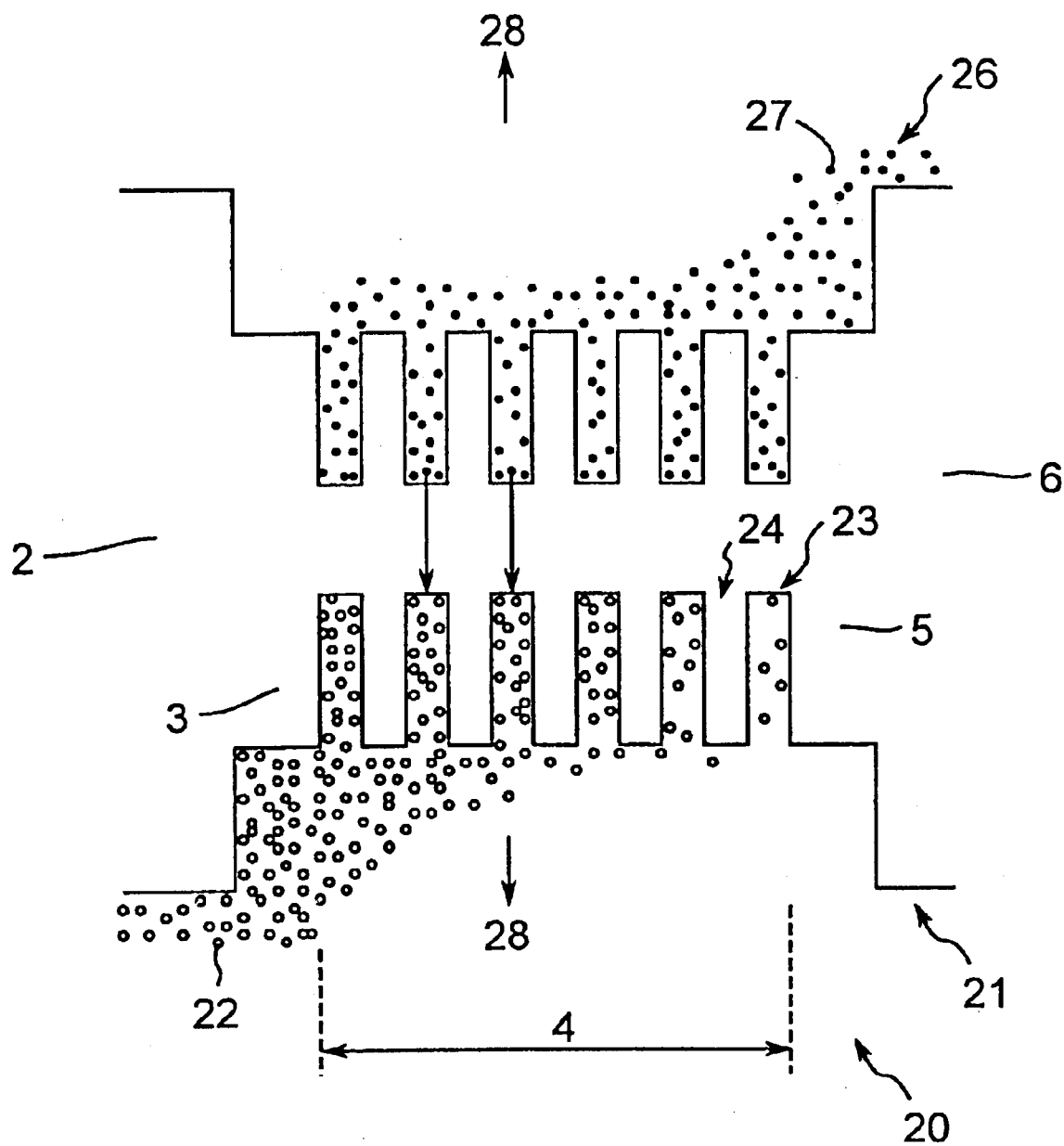
FIG. 4 is a conceptual energy band diagram of a multiple quantum well structure in an active layer of a semiconductor laser.

FIG. 3B is a sectional view of a Bragg reflector laser 30-2. Bragg reflector laser 30-2 is an application of distribution feedback laser 30-1 and can select a desired wavelength. Bragg reflector laser 30-2 can be roughly divided into a light source unit 36 having a multiple quantum well active layer 34 and a wavelength selection unit 37 having a diffraction grating 35. The structure of light source unit 36 is substantially the same as that of multiple quantum well active layer 4 of the semiconductor laser according to the first embodiment.

Multiple quantum well active layer 34 exists only in light source unit 36, and is not arranged in wavelength selection unit 37. In other words, multiple quantum well active layer 34 does not overlap diffraction grating 35. Diffraction grating 35 is arranged at a position distant from the layer surface of multiple quantum well active layer 34 in the spreading direction of the layer surface.

Multiple quantum well active layer 34 of the above configuration can be obtained as follows. That is, after laminating multiple quantum well active layer 4 in the first embodiment, one or more regions of multiple quantum well active layer 4 which overlaps wavelength selection unit 37 are removed by etching or the like. Then, the remaining of the multiple quantum well active layer 4 becomes layer 34.

When an electric field is applied to multiple quantum well active layer 34 by applying a voltage to electrodes 38-1 and 38-2, light source unit 36 emits light. A desired wavelength is selected in wavelength selection unit 37. Light-reflecting films 31 and 32 are the same as those in FIG. 3A, and a description thereof will be omitted.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser comprising:

a p-type cladding layer and an n-type cladding layer; and an active layer between the p-type cladding layer and the n-type cladding layer, the active layer having a multiple quantum well structure with a plurality of alternating barrier layers and well layers, wherein a first of the barrier layers is p-type and has a first dopant concentration and a second of the barrier layers has a second dopant concentration, smaller than the first dopant concentration, and the second barrier layer is located closer to the p-type cladding layer than the first barrier layer.

2. The semiconductor laser according to claim 1, wherein respective dopant concentrations in the plurality of barrier layers gradually decrease along a direction extending from the n-type layer to the p-type cladding layer.

3. The semiconductor laser according to claim 1 wherein the first barrier layer includes zinc as a dopant producing p-type conductivity.

4. The semiconductor laser according to claim 1 including a diffraction grating located directly opposite at least part of the active layer, in a direction transverse to a laser beam produced by the semiconductor laser, so that the semiconductor laser produces a laser beam having a wavelength selected by the diffraction grating.

5. The semiconductor laser according to claim 1 wherein the semiconductor laser includes, serially arranged, a light source region including all of the active layer, and a wavelength selection region including a diffraction grating for selection wavelength of a laser beam produced by the semiconductor laser.

* * * * *